(12) United States Patent
Jones et al.

(10) Patent No.: US 8,770,765 B2
(45) Date of Patent: Jul. 8, 2014

(54) THERMAL MANAGEMENT OF VERY SMALL FORM FACTOR PROJECTORS WITH SYNTHETIC JETS

(71) Applicant: Nuventix, Inc., Austin, TX (US)

(72) Inventors: Lee M. Jones, Austin, TX (US); Samuel N. Heffington, Tulsa, OK (US); Raghavendran Mahalingam, Austin, TX (US)

(73) Assignee: Nuventix, Inc., Austin, TX (US)

( * ) Notice: Subject to any disclaimer, the term of this patent is extended or adjusted under 35 U.S.C. 154(b) by 148 days.

(21) Appl. No.: 13/753,861

(22) Filed: Jan. 30, 2013

(65) Prior Publication Data

US 2013/0162958 A1 Jun. 27, 2013

Related U.S. Application Data

(62) Division of application No. 12/445,114, filed as application No. PCT/US2007/021821 on Oct. 11, 2007, now Pat. No. 8,388,142.

(60) Provisional application No. 60/851,660, filed on Oct. 13, 2006.

(51) Int. Cl.
*G03B 21/16* (2006.01)
*F15D 1/00* (2006.01)
*H04N 9/31* (2006.01)

(52) U.S. Cl.
CPC .............. *G03B 21/16* (2013.01); *F15D 1/0095* (2013.01); *H04N 9/3144* (2013.01); *Y10S 165/908* (2013.01)
USPC ............ 353/57; 353/60; 353/61; 165/104.11; 165/109.1; 165/908

(58) Field of Classification Search
CPC ....... G03B 21/16; H04N 9/31; H04N 9/3144; F15D 1/008; F15D 1/0095; F28F 13/06; F28F 13/12; H01L 23/34; H01L 23/36; H01L 23/367; H01L 23/46; H01L 23/467; H01L 23/473; H01L 23/4735
USPC .......................... 353/52, 54–58, 60–61, 122; 165/104.11, 104.19, 104.23, 104.25, 165/109.1, 908
See application file for complete search history.

(56) References Cited

U.S. PATENT DOCUMENTS

| 3,034,769 | A | 5/1962 | Bertin et al. |
| 5,021,924 | A | 6/1991 | Kieda et al. |
| 5,428,503 | A | 6/1995 | Matsushima et al. |
| 5,647,202 | A | 7/1997 | Althaus |
| 6,588,497 | B1 | 7/2003 | Glezer et al. |
| 7,172,291 | B2 | 2/2007 | Kitabayashi |
| 7,252,140 | B2 | 8/2007 | Glezer et al. |
| 7,327,570 | B2 | 2/2008 | Belady |
| 7,606,029 | B2 * | 10/2009 | Mahalingam et al. ........ 361/700 |
| 7,607,470 | B2 * | 10/2009 | Glezer et al. ................. 165/121 |
| 7,784,972 | B2 * | 8/2010 | Heffington et al. .......... 362/294 |

(Continued)

*Primary Examiner* — Georgia Y Epps
*Assistant Examiner* — Jori S Reilly-Diakun
(74) *Attorney, Agent, or Firm* — John A. Fortkort; Fortkort & Houston P.C.

(57) ABSTRACT

A thermal management device (401) is provided which comprises a synthetic jet actuator (403) and a heat sink (405) comprising a fin (407). The fin has at least one interior channel (409) defined therein which has first and second openings that are in fluidic communication with each other. The synthetic jet actuator is adapted to direct a synthetic jet into said channel.

22 Claims, 7 Drawing Sheets

(56) References Cited

U.S. PATENT DOCUMENTS

| | | | |
|---|---|---|---|
| 8,388,142 B2* | 3/2013 | Jones et al. | 353/57 |
| 2004/0190305 A1* | 9/2004 | Arik et al. | 362/555 |
| 2006/0196638 A1* | 9/2006 | Glezer et al. | 165/80.3 |
| 2007/0119573 A1* | 5/2007 | Mahalingam et al. | 165/80.4 |
| 2007/0119575 A1* | 5/2007 | Glezer et al. | 165/104.33 |
| 2010/0110630 A1 | 5/2010 | Arik et al. | |
| 2011/0024092 A1* | 2/2011 | Gerlach | 165/104.34 |

* cited by examiner

THERMAL MANAGEMENT OF VERY SMALL FORM FACTOR PROJECTORS WITH SYNTHETIC JETS

CROSS-REFERENCE TO RELATED APPLICATIONS

This application is a divisional application of U.S. Ser. No. 12/445,114, filed Apr. 10, 2009, having the same title, and having the same inventors, now allowed, and which is incorporated herein by reference in its entirety; which application claims the benefit of priority from PCT Application Number PCT/US2007/021821, which has an international filing date of Oct. 11, 2007, having the same title, and having the same inventors, and which is incorporated herein by reference in its entirety; and which claims priority to U.S. Provisional Application No. 60/851,660, filed Oct. 13, 2006, having the same title, and having the same inventors, and which is incorporated herein by reference in its entirety.

FIELD OF THE DISCLOSURE

The present disclosure relates generally to thermal management devices, and more particularly to methods for making synthetic jet ejectors.

BACKGROUND OF THE DISCLOSURE

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the noise attendant to their use. Moreover, the use of fans requires relatively large moving parts, and correspondingly high power inputs, in order to achieve the desired level of heat dissipation. Furthermore, while fans are adequate for providing global movement of air over electronic devices, they generally provide insufficient localized cooling to provide adequate heat dissipation for the hot spots that typically exist in semiconductor devices and in many types of electronic equipment.

More recently, thermal management systems have been developed which utilize synthetic jet ejectors. These systems are more energy efficient than comparable fan-based systems, and also offer reduced levels of noise and electromagnetic interference. Systems of this type are described in greater detail, for example, in U.S. Pat. No. 6,588,497 (Glezer et al.). The use of synthetic jet ejectors has proven very efficient in providing localized heat dissipation, and hence can be used to address hot spots in semiconductor devices and electronic equipment. Synthetic jet ejectors may be used in conjunction with fan-based systems to provide thermal management systems that afford both global and localized heat dissipation.

Despite their notable advantages, however, there is a need in the art for further improvements in thermal management systems which utilize synthetic jet ejectors. In particular, new electronic devices are currently under development which pose significant challenges to existing thermal management solutions.

As a specific example, various low form factor projector systems are currently known to the art. These projector systems are advantageous in that they are significantly more portable than conventional projector systems. However, at present, these devices offer relatively poor contrast ratios, and hence the images they generate are clearly visible only in darkened rooms. Led technology offers a potential solution to this issue by significantly increasing the number of lumens generated by the projector so that the images generated by the device will be clearly visible even in normal ambient lighting conditions. Moreover, LED light sources are inherently compact, and do not themselves contribute significantly to the size of the projector. However, the thermal management solutions currently available for these devices do not provide sufficient heat dissipation for such technology to be implemented, and also adversely affect the size of the device.

There is thus a need in the art for a thermal management solution which addresses these infirmities. These and other needs are met by the devices and methodologies described herein.

DETAILED DESCRIPTION

In one aspect, a thermal management device is provided which comprises a synthetic jet actuator and a heat sink comprising a fin. The fin has at least one interior channel defined therein which has first and second openings that are in fluidic communication with each other. The synthetic jet actuator is adapted to direct a synthetic jet into said channel.

In another aspect, a thermal management device is provided which comprises a synthetic jet actuator, a heat sink, and first and second conduits. The synthetic jet actuator is adapted to direct a first synthetic jet into a first end of said heat sink, and the first conduit is adapted to direct a synthetic jet into a second end of said heat sink.

It has now been found that the aforementioned needs in the art may be met through the provision of a thermal management system comprising a synthetic jet actuator and one or more heat sinks, and by constructing the one or more heat sinks such that the length of the one or more heat sinks provides a higher average heat transfer coefficient. This may be accomplished, for example, by replacing a single, longer heat sink with multiple, shorter heat sinks, or by extending the width, and shortening the length, of a single heat sink.

Figure 1:
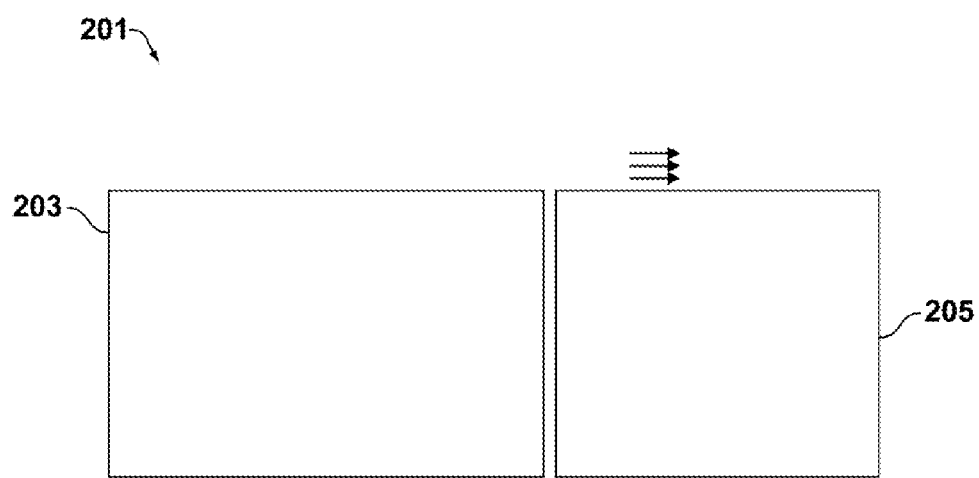
FIG. 1 is an illustration of a prior art thermal management system comprising a synthetic jet actuator and a single heat sink.

FIG. 1 illustrates a known thermal management system. The thermal management system 201 depicted therein comprises a synthetic jet actuator 203 and a single heat sink 205.

The heat sink 205 in this particular embodiment is 50 mm in length. The arrows indicate the direction of airflow in the device. It will be appreciated that, while the particular thermal management system 201 is equipped with a rectangular synthetic jet actuator 203, it may also be equipped with a circular synthetic jet actuator 203.

Figure 3:
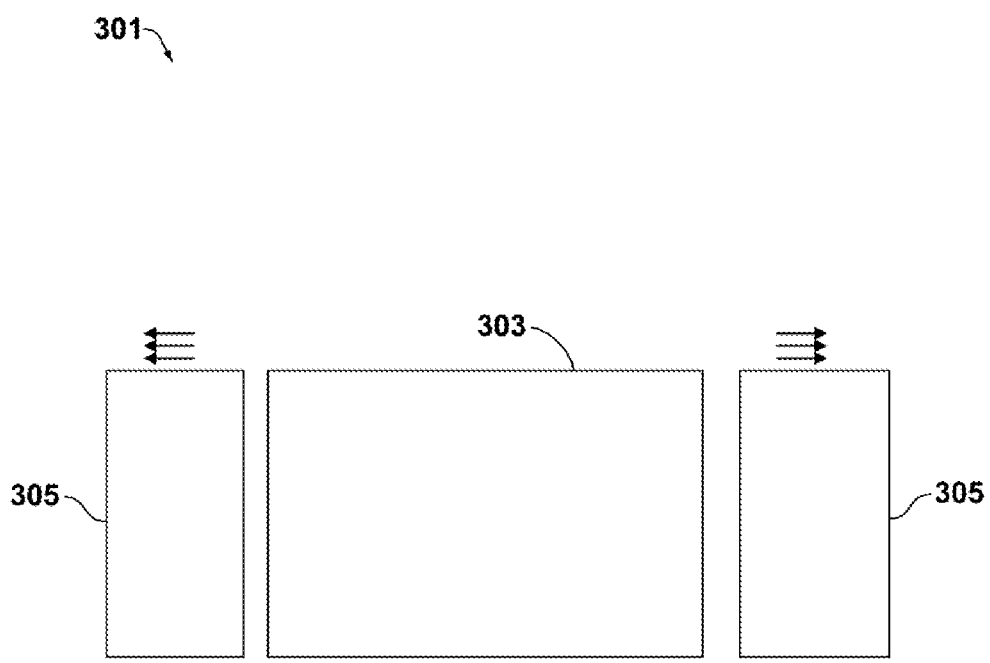
FIG. 3 is an illustration of a thermal management system in accordance with the teachings herein comprising a synthetic jet actuator and dual heat sinks.

With reference to FIG. 3, a first particular, non-limiting embodiment of a thermal management system is depicted. While similar in some respects to the system depicted in FIG. 1, the thermal management system 301 of FIG. 3 is provided with two separate heat sinks 305 that are approximately half the length of the heat sink 205 depicted in FIG. 1 (that is, the heat sinks 305 in the system of FIG. 3 are 25 mm in length).

Figure 2:
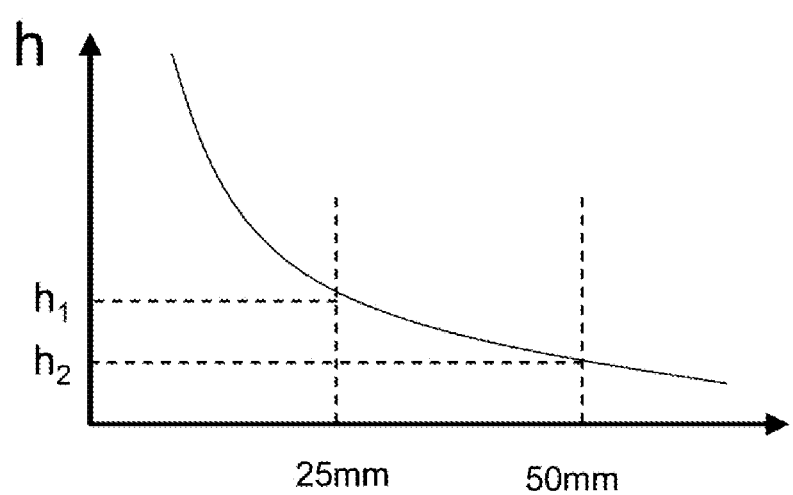
FIG. 2 is a graph demonstrating the advantage of dual heat sinks over a single heat sink of the same aggregate size.

The advantageous effect of the thermal management system 301 of FIG. 3 over the thermal management system 201 of FIG. 1 may be appreciated with respect to FIG. 2, which is a graph of the heat transfer coefficient of the device as a function of length. As seen therein, the provision of a thermal management system having two heat sinks of shorter length significantly improves the heat transfer efficiency of the device as compared to the provision of a thermal management system having only a single, longer heat sink of the same aggregate length. In effect, this modification moves the device further up on the heat transfer coefficient curve.

While the device of FIG. 3 achieves greater heat transfer efficiency by essentially dividing the heat sink into two or more units of lesser length, it will be appreciated that a similar result may be achieved in a variety of other ways. For example, the width of the heat sink may be reduced while keeping the total area of the heat sink constant. In some embodiments, this may be accomplished by manipulating the geometry of the heat sink. Thus, for example, in some embodiments, a rectangular heat sink may be replaced with a heat sink that is arcuate or annular in shape.

It will also be appreciated that this technique can be utilized to maximize the efficiency of the heat sink for the amount and geometry of the space provided. Thus, for example, appropriate ducting or channels may be utilized to direct a synthetic jet originating from the synthetic jet actuator to any location which can accommodate the heat sink(s). Consequently, the heat sinks need not be disposed in the same plane, and may be, for example, stacked or staggered as available real estate permits. Moreover, the heat sinks can be cooled with a single synthetic jet actuator, and each heat sink may have a different flow direction (something not typically possible with fan-based thermal management systems).

Figure 4:
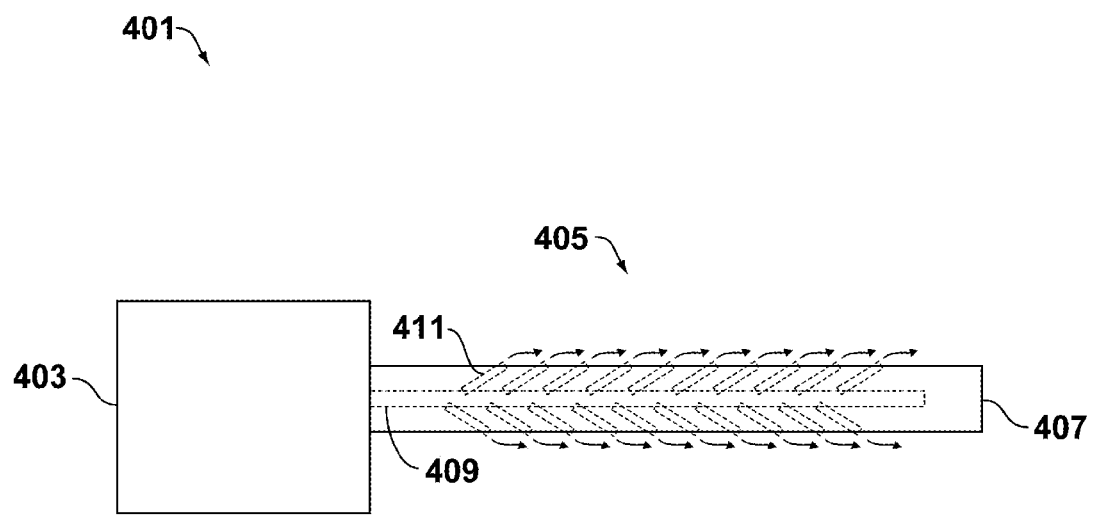
FIG. 4 is an illustration of a thermal management system in accordance with the teachings herein which includes a heat sink equipped with direct air plumbing (DAP)

FIG. 4 depicts another particular, non-limiting embodiment of a thermal management system made in accordance with the teachings herein. The thermal management system 401 depicted therein comprises a synthetic jet actuator 403 which is in fluidic communication with a heat sink 405 comprising one or more heat fins 407. In particular, the synthetic jet actuator 403 is oriented to direct a synthetic jet along a main channel 409 defined in the interior of the heat fin 407.

In the particular embodiment depicted, a plurality of sub-channels 411 are also defined in the interior of the heat fin 407. These sub-channels 411 are in fluidic communication with the main channel 409, and serve to direct a plurality of synthetic jets or sub-jets (derived from the synthetic jet traveling through the main channel 409) into the ambient environment, and preferably along the outer surface of the heat fin 407 and/or along the longitudinal axis of the heat fin 407. Depending on the implementation, such an embodiment can provide improved heat transfer and fluid flow through the heat sink. Such an embodiment may also be used to provide multidirectional fluid flow where such a flow is desirable.

The plurality of sub-channels preferably comprises first and second sets of sub-channels, wherein the first set of sub-channels have longitudinal axes parallel to a first axis, and wherein the second set of sub-channels have longitudinal axes parallel to a second axis. The first and second axes may be disposed at various angles to each other, but are preferably disposed at an angle within the range of about 60° to about 120°, and more preferably at an angle within the range of about 75° to about 105°. Most preferably, the first and second axes are orthogonal.

In variations of this type of embodiment, further sets of sub-channels may be provided which are disposed at other angles. Moreover, it will be appreciated that, while FIG. 4 depicts only a single fin, embodiments are possible in accordance with the teachings herein which include a plurality of fins, and wherein each of the plurality of fins has a configuration the same as, or similar to, that depicted in FIG. 4.

Figure 5:
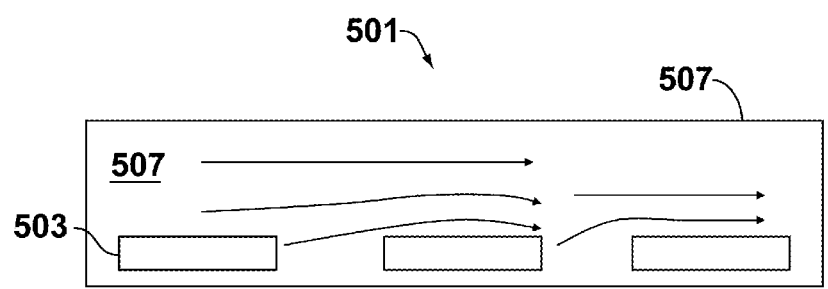
FIG. 5 is an illustration of a thermal management system in accordance with the teachings herein which utilizes multiple synthetic jets to create low pressure pockets and a cascading, long-length flow.

FIG. 5 depicts a further particular, non-limiting embodiment of a thermal management system 501 in accordance with the teachings herein. In this embodiment, a plurality of synthetic jet actuators 503 are utilized to achieve a desired flow of fluid along a conduit 505 or passageway. Such an embodiment is particularly desirable where the conduit or passageway is relatively long. In such a case, the use of multiple synthetic jet actuators creates low pressure pockets that facilitate a cascading, long-length flow by essentially giving the synthetic jet flow stream a periodic "boost". It will be appreciated that the use of directed air plumbing (DAP), such as that depicted in FIG. 4, may be employed to similar effect in this type of device.

Figure 6:
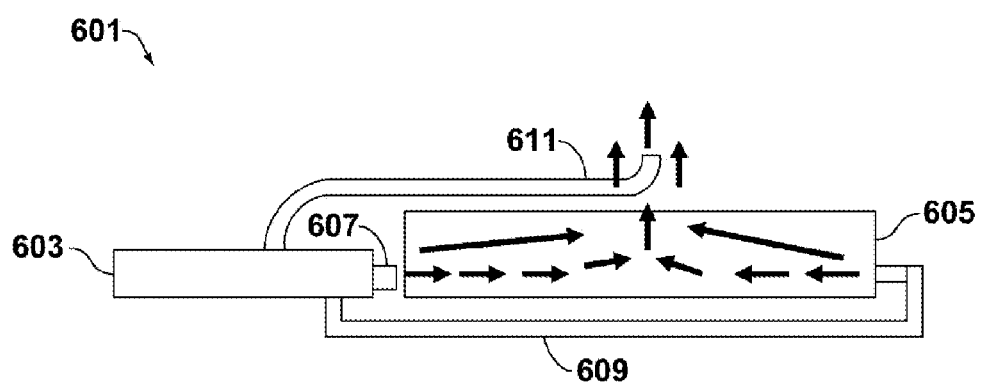
FIG. 6 is an illustration of a thermal management system in accordance with the teachings herein which utilizes DAPs to create low pressure pockets to facilitate the movement of air through a heat sink.

FIG. 6 depicts yet another particular, non-limiting embodiment of a thermal management system 601 in accordance with the teachings herein. The thermal management system 601 depicted therein comprises a synthetic jet actuator 603 which is in fluidic communication with a heat sink 605. In the particular embodiment depicted, the synthetic jet actuator 603 is equipped with a first conduit 607 which emits a first synthetic jet into one end of the heat sink 605, and a second conduit 609 which emits a second synthetic jet into the opposing end of the heat sink 605. The synthetic jet actuator 603 is further equipped with a third conduit 611 which emits a third synthetic jet in a direction perpendicular to, and away from, the heat sink 605.

In the thermal management system 601 depicted in FIG. 6, the third conduit 611 facilitates fluid flow through the heat sink 605 by creating a low pressure zone above the heat sink 605. It will also be appreciated that the third conduit 611 modifies the direction of fluid flow through creation of the low pressure zone. Hence, this type of embodiment may be used as a means to tailor fluid flow through a heat sink so as to optimize heat exchange and/or to reduce acoustic emissions.

Figure 7:
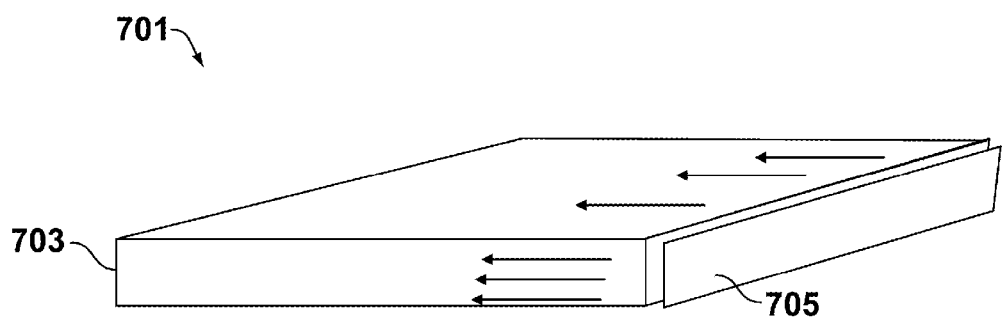
FIG. 7 is an illustration of an LED projector in accordance with the teachings herein.

FIG. 7 depicts a particular, non-limiting embodiment of an LED projector 701 equipped with a thermal management system in accordance with the teachings herein. The LED projector 701 is equipped with a synthetic jet actuator 703 which is placed on the periphery of the projector such that the jets produced by the synthetic jet actuator 703 flow over the cover or chassis 705 of the projector at specified locations. In such an embodiment, the portion (or portions) of the chassis 705 over which the synthetic jets are directed may be in thermal contact with thermal pads, thermal interface materials, or heat pipes that conduct heat from one or more heat sources to those portions of the chassis 705. The chassis 705 may be equipped with ridges or extended surfaces to increase the surface area available for heat transfer. In some embodiments, these extended surfaces may be equipped with primary and secondary channels of the type depicted in FIG. 4.

As indicated by the device of FIG. 7, the various embodiments of the thermal management systems described herein may be employed as, or incorporated into, the thermal management systems of LED projectors and other devices that generate significant amounts of heat. The versatility of design inherent in these systems can be used to take advantage of available real estate. Moreover, the channels, passageways and conduits utilized by these devices can be incorporated into the walls, housing, chassis or packaging of the host device.

In the case of LED projectors, the improved heat transfer properties afforded by the thermal management systems described herein may improve the performance of the device, or may permit adaptations of the device that are not possible with current thermal management solutions. For example, the greater efficiency possible with the thermal management systems described herein may allow DAP projectors to operate at higher lumens than existing thermal management solutions, thereby permitting an improvement in the image contrast ratio achievable with these devices.

It will also be appreciated that the devices and methodologies described herein may be used in conjunction with other thermal management features as are known to the art. For example, the systems described herein may be used in conjunction with fan-based thermal management systems, where synthetic jets may be employed to direct global fluid flow or to provide or augment thermal management on a local level. The systems described herein may also be used in conjunction with various heat pipes or heat fins, the later of which may be disposed interior or exterior to the host device. As a specific example, the thermal management systems described herein may be used in conjunction with a heat pipe having heat fins soldered directly to it.

In some embodiments of the systems and methodologies described herein, actively controlled synthetic jets may be utilized to regulate LED die temperatures in LED projectors and other devices. In some such embodiments, the actively controlled synthetic jets may serve to regulate LED die temperatures for the purpose of controlling both the flux of the light output and the spectral footprint of the light emitted. In other such embodiments, DAP may be utilized to cool only the LED.

In still other embodiments, the synthetic jet actuator may be utilized to eliminate or reduce acoustic emissions, or to produce certain sounds. Thus, for example, the synthetic jet actuator may utilize a speaker diaphragm which, under certain conditions, emits a sound profile or signal to indicate a certain state of the device. Such a state may indicate, for example, that the device is warming up, that an operational problem has been encountered, or that the device requires servicing.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A thermal management device, comprising:
   a heat sink having first and second opposing ends;
   a synthetic jet ejector which directs a first synthetic jet into said first end of said heat sink;
   a first conduit, in fluidic communication with said synthetic jet ejector, which directs a second synthetic jet into said second end of said heat sink; and
   a second conduit, in fluidic communication with said synthetic jet ejector, which directs a third synthetic jet in a direction which is essentially perpendicular to the flow of at least one of said first and second synthetic jets.

2. The thermal management system of claim 1, wherein said second conduit is adapted to direct a third synthetic jet in a direction essentially perpendicular to the flow of each of said first and second synthetic jets.

3. The thermal management system of claim 1, wherein said second conduit creates a low pressure zone adjacent to said heat sink.

4. The thermal management system of claim 1, wherein said second conduit has a terminal end which is disposed adjacent to said heat sink.

5. The thermal management system of claim 4, wherein said terminal end is directed away from said heat sink.

6. The thermal management system of claim 5, wherein said second conduit directs a third synthetic jet in a direction essentially perpendicular to the flow of each of said first and second synthetic jets.

7. The thermal management system of claim 1, wherein said heat sink comprises a plurality of fins, and wherein said first and second jets are directed along the longitudinal axis of said heat sink.

8. The thermal management system of claim 7, wherein said heat sink comprises a plurality of fins, wherein said plurality of fins define a plurality of channels, wherein each of said plurality of channels is defined by the space between adjacent pairs of fins.

9. The thermal management system of claim 8, wherein said first synthetic jet is a first plurality of synthetic jets, and wherein said second synthetic jet is a second plurality of synthetic jets.

10. The thermal management system of claim 9, wherein each of said first plurality of synthetic jets is directed into one of said plurality of channels from said first end of said heat sink.

11. The thermal management system of claim 10, wherein each of said second plurality of synthetic jets is directed into one of said plurality of channels from said second end of said heat sink, and wherein each channel in said plurality of channels has at least one of said first plurality of synthetic jets directed into it and at least one of said second plurality of synthetic jets directed into it.

12. The thermal management system of claim 1, wherein said heat sink comprises a plurality of fins, and wherein each of said plurality of fins has a first major surface which is planar.

13. The thermal management system of claim 12, wherein said plurality of fins are arranged with their first major surfaces parallel to a common axis.

14. The thermal management system of claim 13, wherein said first and second jets are directed parallel to said common axis.

15. The thermal management device of claim 14, wherein said synthetic jet ejector and said heat sink are components of an integral unit.

16. The thermal management device of claim 14, wherein said first and second conduits are disposed along first and second major surfaces of said heat sink.

17. The thermal management device of claim 16, wherein said first and second major surfaces are opposing surfaces.

18. The thermal management device of claim 1, wherein said first and second ends of said heat sink are disposed along opposing ends of the longitudinal axis of said heat sink.

19. A projector comprising the thermal management device of claim 1, wherein said projector comprises an LED light source which is in thermal communication with said heat sink.

20. The projector of claim 19, wherein said heat sink is in thermal contact with said first LED by way of an element selected from the group consisting of thermal interface materials and heat pipes.

21. The thermal management device of claim 1, wherein said heat sink comprises a rectangular base with a plurality of fins disposed thereon, and wherein the longitudinal axis of each of the plurality of fins is adjacent to the longitudinal axis of each other of said plurality of fins.

22. The thermal management device of claim 1, wherein said heat sink comprises a plurality of fins, wherein said plurality of fins define a plurality of channels such that each of said plurality of channels is defined by the space between adjacent pairs of fins, wherein said synthetic jet ejector directs a first synthetic jet into a first end of a first channel of said plurality of channels, and wherein said first conduit directs a second synthetic jet into a second end of said first channel of said plurality of channels.

\* \* \* \* \*